US012604729B2

(12) United States Patent
Tao

(10) Patent No.: US 12,604,729 B2
(45) Date of Patent: Apr. 14, 2026

(54) DEVICES INCLUDING CAPACITOR COUPLING POWER PATH TO GROUND PATH AND ASSOCIATED COMPONENTS AND SYSTEMS

(71) Applicant: Microchip Technology Incorporated, Chandler, AZ (US)

(72) Inventor: Yuming Tao, Ottawa (CA)

(73) Assignee: Microchip Technology Incorporated, Chandler, AZ (US)

( * ) Notice: Subject to any disclaimer, the term of this patent is extended or adjusted under 35 U.S.C. 154(b) by 711 days.

(21) Appl. No.: 18/047,470

(22) Filed: Oct. 18, 2022

(65) Prior Publication Data

US 2023/0124251 A1 Apr. 20, 2023

Related U.S. Application Data

(60) Provisional application No. 63/262,764, filed on Oct. 20, 2021.

(51) Int. Cl.
| | |
|---|---|
| *H01L 23/522* | (2006.01) |
| *H01L 23/00* | (2006.01) |
| *H01L 23/528* | (2006.01) |
| *H10D 1/68* | (2025.01) |

(52) U.S. Cl.
CPC ...... *H01L 23/5223* (2013.01); *H01L 23/5226* (2013.01); *H01L 23/528* (2013.01); *H01L 24/16* (2013.01); *H10D 1/68* (2025.01); *H01L 2224/16257* (2013.01)

(58) Field of Classification Search
CPC .................. H10D 1/68; H05K 3/4602; H05K 2201/09345; H05K 2201/10015; H05K 2201/1003; H05K 2201/1006; H05K 1/233; H01L 23/5223; H01L 23/5226; H01L 23/528; H01L 24/16; H01L 2224/16257; H01L 23/49816; H01L 23/49822; H01L 23/49827; H01L 23/49838; H01L 23/50
See application file for complete search history.

(56) References Cited

U.S. PATENT DOCUMENTS

| | | | | |
|---|---|---|---|---|
| 6,058,000 A | * | 5/2000 | Koenck | G06K 17/0022 361/91.1 |
| 9,893,701 B1 | * | 2/2018 | Plasterer | H05K 7/1457 |

(Continued)

OTHER PUBLICATIONS

Ramesh K. Filter circuits; SE III EDC 1.2017 (Year: 2017).*

(Continued)

*Primary Examiner* — Galina G Yushina
(74) *Attorney, Agent, or Firm* — TraskBritt

(57) ABSTRACT

The device may include a core. The device may include built-up layers arranged over the core. The device may also include a ground path disposed in a first built-up layer of the built-up layers. The device may also include a power path disposed in a second built-up layer of the built-up layers. The device may also include a multi-terminal capacitor on a top layer of the built-up layers. The multi-terminal capacitor may be coupled to the ground path and the power path through respective vias passing through the built-up layers. The respective vias may be arranged to alternate such that respective vias coupled to the power path neighbor a respective via coupled to the ground path.

19 Claims, 4 Drawing Sheets

(56)  References Cited

U.S. PATENT DOCUMENTS

| | | | | |
|---|---|---|---|---|
| 2002/0195700 A1* | 12/2002 | Li | H01J 9/326 | |
| | | | | 438/622 |
| 2006/0046571 A1* | 3/2006 | Kosmala | H01R 13/719 | |
| | | | | 439/620.1 |
| 2007/0102811 A1 | 5/2007 | Swaminathan et al. | | |
| 2008/0149369 A1* | 6/2008 | Kawamura | H05K 3/3452 | |
| | | | | 257/E23.06 |
| 2008/0258259 A1 | 10/2008 | Osaka et al. | | |
| 2015/0236681 A1* | 8/2015 | We | H05K 1/0306 | |
| | | | | 174/258 |
| 2019/0244883 A1* | 8/2019 | Ong | H05K 3/3405 | |
| 2020/0105653 A1* | 4/2020 | Elsherbini | H01L 23/645 | |
| 2021/0119542 A1* | 4/2021 | Clavette | H02M 3/1582 | |
| 2022/0416749 A1* | 12/2022 | Lee | H03H 7/06 | |

OTHER PUBLICATIONS

Harris, Mark, Pi Filter Designs for Power Supplies, Altium, Jul. 19, 2021, pp. 1-5, Retrieved from the Internet: URL:https://web. archive.org/web/2021072722 1429/https://resources.altium.com/p/pi-filter-designs-power-supplies [retrieved on Jan. 26, 2023].

International Search Report for International Application No. PCT/US2022/078286, mailed Feb. 6, 2023, 5 pages.

International Written Opinion for International Application No. PCT/US2022/078286, mailed Feb. 6, 2023, 8 pages.

Makharashvili T et al., Inductance Models 7-15 of 8-Terminal Decoupling Capacitors, 2018 IEEE 27th Conference On Electrical Performance of Electronic Packaging and Systems (EPEPS), IEEE, Oct. 14, 2018, pp. 245-247.

Makharashvili, Tamar et al., Circuit Models for the Inductance of Eight-Terminal Decoupling Capacitors, IEEE Transactions On Components, Packaging and Manufacturing Technology, IEEE, USA, vol. 10, No. 1, Nov. 7, 2019, pp. 142-150.

Sclocchi, Michele et al., Input Filter Design for Switching Power Supplies, National Semiconductor Corporation, 2010, Texas Instruments Literature No. SNVA538, 21 pages.

Kuo, Hung-Chun, et al. "On-Package Decoupling Capacitor Performance Improvement of Flip-Chip Packages for High Power Application," 2018 13th International Microsystems, Packaging, Assembly and Circuits Technology Conference (IMPACT), 2018, pp. 245-247.

* cited by examiner

DEVICES INCLUDING CAPACITOR COUPLING POWER PATH TO GROUND PATH AND ASSOCIATED COMPONENTS AND SYSTEMS

CROSS-REFERENCE TO RELATED APPLICATION

This application claims the benefit under 35 U.S.C. § 119(e) of U.S. Provisional Patent Application Ser. No. 63/262,764, filed Oct. 20, 2021, the disclosure of which is hereby incorporated herein in its entirety by this reference.

TECHNICAL FIELD

Examples of the present disclosure generally relate to devices. In particular, examples of the present disclosure relate to devices including a noise filtering apparatus and associated components and systems.

BACKGROUND

As the bandwidth demands increase to multi-tens and hundreds of gigabytes per second (Gbps), for both Ethernet data and communication, the power consumption of electronic dies, such as integrated circuits (IC) in the associated electronic devices becomes higher and higher. On the other hand, transistor size scaling has allowed the integration of millions of transistors within an electronic die. With lower gate capacitance and lower voltage, faster transistors have become available. Increased transistor integration resulted in an increased current supplied to the integrated circuit, thereby increasing the power utilization. Lower voltage may make the power supply to the integrated circuit more vulnerable to noise.

In some cases, a power supply from one voltage regulator module may be shared among the blocks (e.g., sub-circuitries) within an integrated circuit (IC) where some blocks may experience transient activities resulting in larger power-supply-induced-noise while other blocks may need cleaner power delivery.

BRIEF SUMMARY

Examples of the disclosure may include a device. The device may include an electronic die, a ground circuit, and a power supply circuit coupled to the electronic die. The power supply circuit may include a first capacitor coupled between the power supply circuit and the ground circuit. The device may also include a quiet power supply circuit coupled to the electronic die, the quiet power supply circuit including a second capacitor coupled between the quiet power supply circuit and the ground circuit. The device may also include an inductor coupled between the quiet power supply circuit and the power supply circuit.

Another example of the disclosure may include a device. The device may include a core. The device may also include one or more built-up layers arranged over the core. The device may also include a ground circuit disposed in a first built-up layer of the one or more built-up layers. The device may also include a power supply circuit disposed in a second built-up layer of the one or more built-up layers. The device may also include a multi-terminal capacitor on a top layer of the one or more built-up layers. The multi-terminal capacitor may be coupled to the ground circuit and the power supply circuit through respective vias passing through the one or more built-up layers. The respective vias may be arranged to alternate such that respective vias coupled to the power supply circuit neighbor a respective via coupled to the ground circuit.

Another example of the disclosure may include a method. The method may include forming at least two built-up layers over a core. The method may also include forming a power path and a clean power path on a first built-up layer of the at least two built-up layers. The method may also include forming at least one ground path on a second built-up layer of the at least two built-up layers. The method may also include coupling the power path to the at least one ground path through a first capacitor. The method may also include coupling the clean power path to the at least one ground path through a second capacitor. The method may also include coupling the power path to the clean power path with an inductor.

BRIEF DESCRIPTION OF THE DRAWINGS

While the specification concludes with claims particularly pointing out and distinctly claiming examples of the present disclosure, the advantages of examples of the disclosure may be more readily ascertained from the following description of examples of the disclosure when read in conjunction with the accompanying drawings in which:

DETAILED DESCRIPTION

Figure 1:
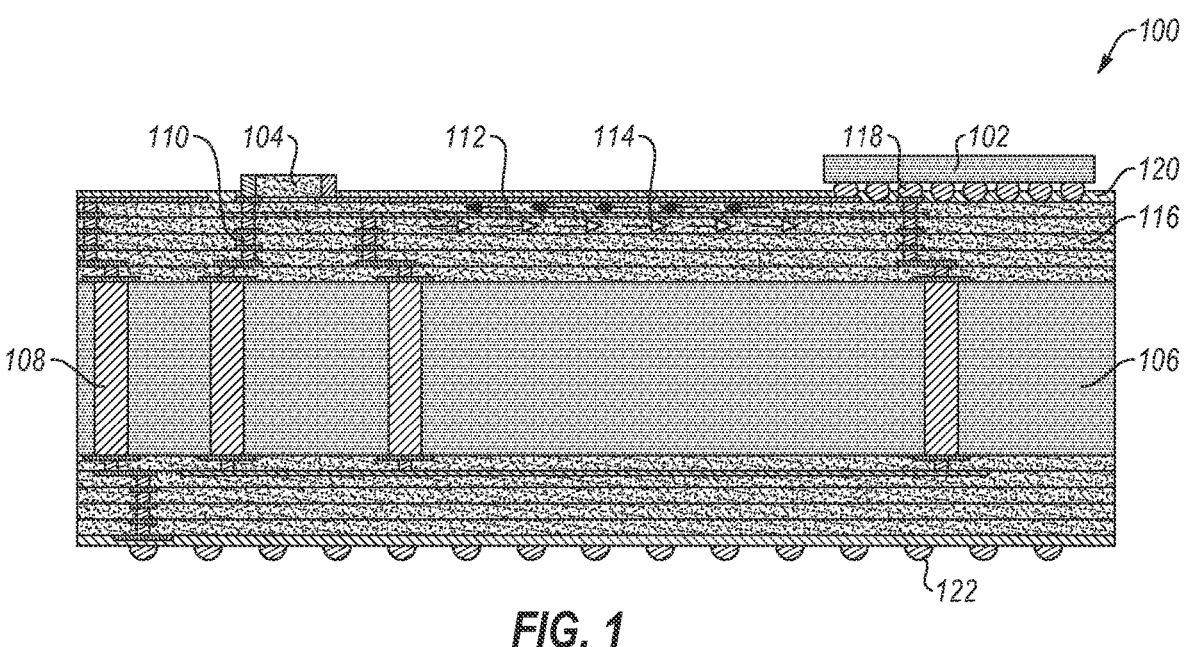
FIG. 1 illustrates a cross-sectional view of a device package in accordance with one or more examples of the present disclosure.

The illustrations presented herein are not meant to be actual views of any particular device or component thereof, but are merely idealized representations employed to describe illustrative examples. The drawings are not necessarily to scale.

As used herein, the term "multi terminal capacitor" means and includes a capacitor having greater than two terminals, such as four terminals, six terminals, eight terminals, or more terminals.

As used herein, the term "equivalent series inductance" or "ESL" means and includes the equivalent inductance of an electrical component. For example, electrical components, such as resistors, paths, vias, capacitors, and others connected to a circuit contain inherent inductance. When modelling the electrical component they may be evaluated as the electrical component (e.g., resistance, capacitance, without limitation) and an inductor in series representing the inductance of the electrical component. The modelled inductor may be representative of the "equivalent series inductance" of the electrical component.

As used herein the term "quiet" or "quiet power" means and includes power having a noise level less than supply power, such as less than about 15 millivolts peak to peak (mVpp), or less than about 11 mVpp, or less than about 3 mVpp.

As used herein, the term "substantially" in reference to a given parameter means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, at least about 99% met, or even at least about 100% met.

As used herein, relational terms, such as "first," "second," "top," "bottom," without limitation, are generally used for clarity and convenience in understanding the disclosure and accompanying drawings and do not connote or depend on any specific preference, orientation, or order, except where the context clearly indicates otherwise.

As used herein, the term "or" means and includes any and all combinations of one or more of the associated listed items. The term "or" is not exclusive of other elements included in the one or more associated listed items.

As used herein, the terms "vertical" and "lateral" refer to the orientations as depicted in the figures.

Dynamic power noise (referred to in the art as di/dt noise), may be caused by the parasitic inductance of a package or printed circuit board (PCB) through chip current transients. To reduce dynamic power noise, or undesirable effects thereof, a decoupling capacitor may be used. The decoupling capacitor may be on-PCB, on-package or on-die. When the anti-resonance frequency of a power delivery network formed by an on-die decoupling capacitor and package with PCB inductance is selected at around 100 to 300 MHz, on-die decoupling capacitors may filter this noise. However, on-die decoupling capacitors may be expensive. Furthermore, limited die area may limit the number of on-die decoupling capacitors available, which may limit the filtering ability of the on-die decoupling capacitors. On-package decoupling capacitors may be used to suppress the power supply induced noise (PSN) over frequency ranges similar to the on-die decoupling capacitors discussed above.

FIG. 1 illustrates a cross-sectional view of an example package for a device 100 (also referred to herein as "device package 100" or just a "device 100"). The device 100 may be formed from a core 106 and one or more built-up layers 116 formed over the core 106. For example, the device package 100 may include five built-up layers 116 over and under the core 106 as illustrated in FIG. 1. In other examples, the built-up layers 116 over and under the core 106 of the device package 100 may range from one built-up layer 116 over and under the core 106, respectively, to ten built-up layers 116 over and under the core 106, respectively, such as two built-up layers 116, four built-up layers 116, six built-up layers 116 or any number of built-up layers 116. The core 106 may include one or more core vias 108 extending through the core 106 connecting the built-up layers 116 on opposite sides of the core 106. In other examples, the device 100 may be formed from built-up layers 116 without a core 106 (e.g., coreless stack-up layers, without limitation). The built-up layers 116 may include circuitry (e.g., conductive paths, traces, vias, without limitation), devices (e.g., capacitors, inductors, resistors, without limitation), connection points (e.g., solder pads, terminals, pins, without limitation), silk layers, or copper layers, without limitation.

The device 100 may include interconnects 122, such as solder balls, pins, solder pads, without limitation, extending from a bottom layer of the device 100. The interconnects 122 may be to connect the device 100 to another electronic device, such as a printed circuit board (PCB), or another device, without limitation.

The device 100 may include an electronic die 102 (i.e., a die to-be-powered) as a non-limiting example, a die including integrated circuitry. Electronic die 102 is also referred to herein as a "die 102", such as an integrated circuit die or integrated circuit chip, mounted to the device 100 through multiple interconnects 118 coupled to connection points in a top layer 120 (e.g., solder mask layer) of the device 100. The interconnects 118 may couple the die 102 to one or more power paths 112 (e.g., circuits for supplying power, such as power traces, power planes, power vias, power circuits, without limitation) and one or more ground paths 114 (e.g., circuits for supplying power, such as ground traces, ground planes, ground vias, ground circuits, without limitation) located within built-up layers 116 of the device 100. For example, the power paths 112 or the ground paths 114 may be located on metal layers within the built-up layers 116. A capacitor 104 (e.g., decoupling capacitor) may be positioned on the top layer 120 of the device 100. The capacitor 104 may be to filter noise out of power being provided to the die 102 through the power path 112. In some examples, the capacitor 104 may be to supplement further power noise filtering accomplished by decoupling capacitors on die 102 (i.e., on-die decoupling capacitors). In other examples, the capacitor 104 may be to filter noise out of the power, such that the die 102 may not include additional on-die decoupling capacitors.

Figure 4:
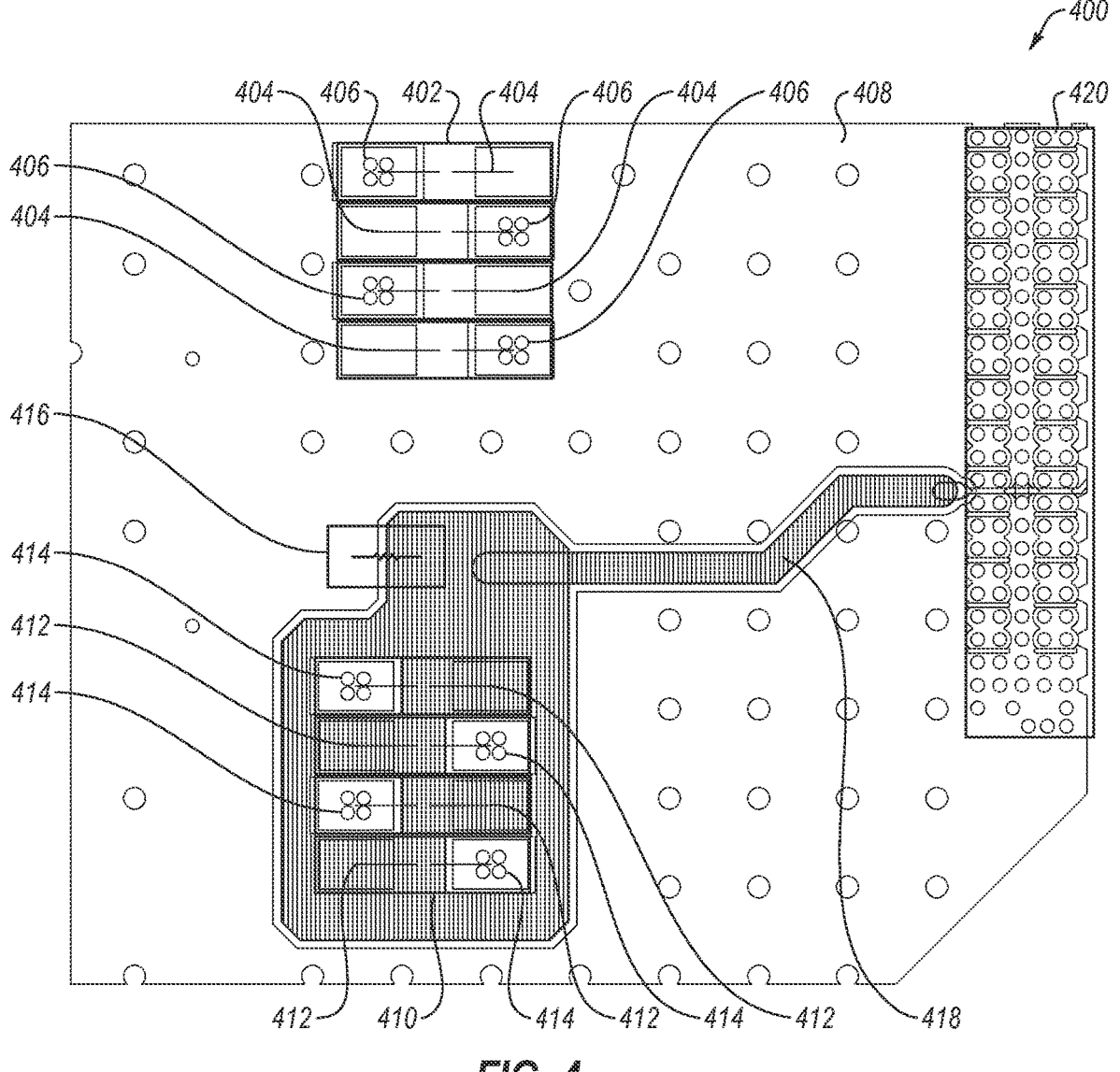
FIG. 4 illustrates a layout view of a layer of a device package in accordance with one or more examples of the present disclosure.
Figure 5:
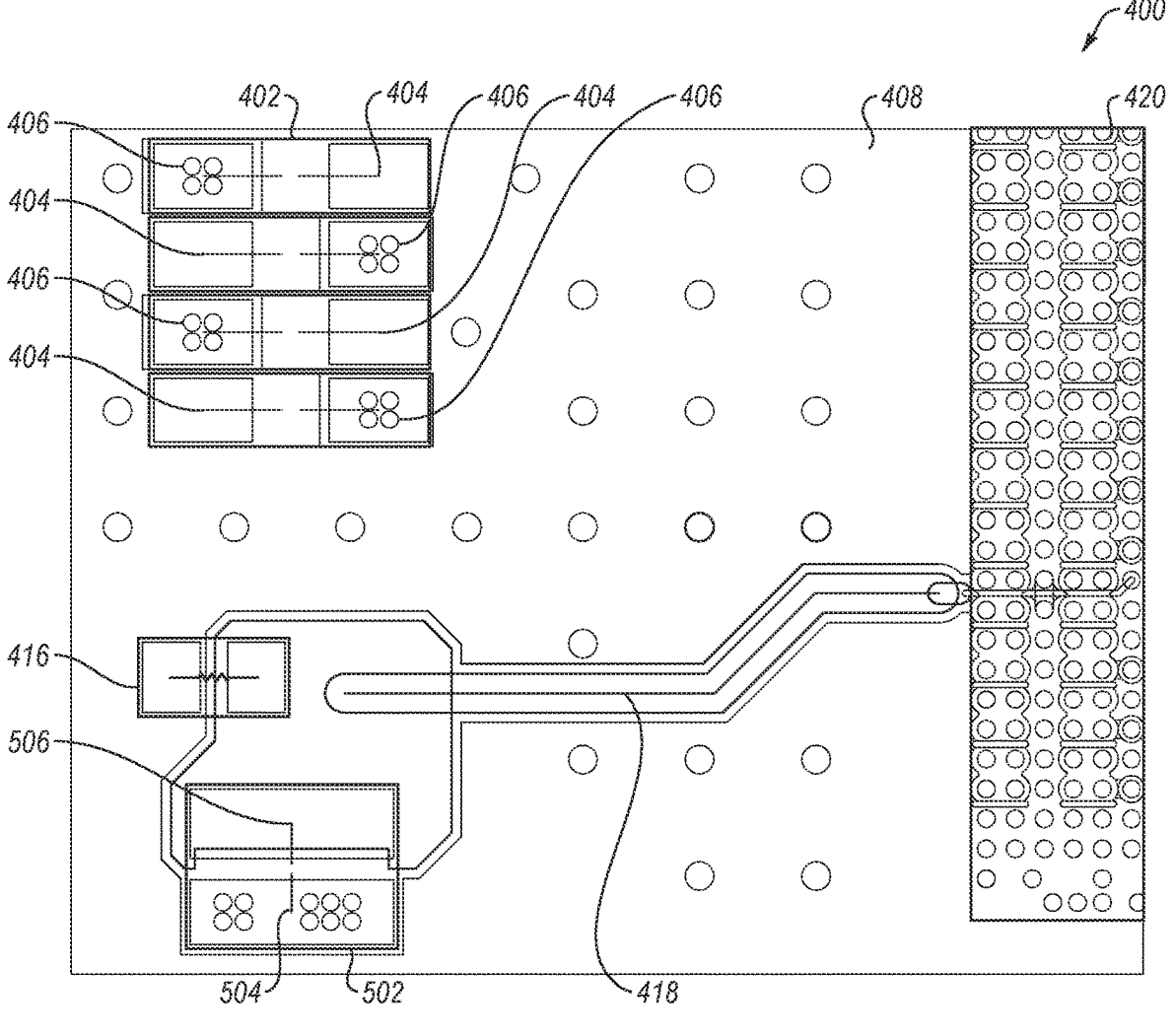
FIG. 5 illustrates a layout view of a layer of a device package in accordance with one or more examples of the present disclosure.

The capacitor 104 may be a two-terminal capacitor, or a multi-terminal capacitor. The capacitor 104 may be electrically coupled between the power paths 112 and the ground paths 114 of the device 100. The capacitor 104 may have a low equivalent series inductance (ESL). A multi-terminal capacitor may be arranged, such that current flows in the reverse directions among neighboring positive/negative terminal pairs. For example, the multi-terminal capacitor may be a multi-layer ceramic capacitor (MLCC capacitor), which has low ESL with high frequency characteristics due to the design structure. The terminal pairs may be arranged to alternate, such that positive terminals of each neighboring terminal pair are adjacent to the negative terminals of the neighboring terminal pairs, as illustrated in FIGS. 4 and 5. Since the current flows in the reverse direction among the neighboring positive/negative terminal pairs, the ESL may be further reduced with the negative mutual inductance. The current may also partially flow into the adjacent electrodes, reducing the ESL further.

As illustrated in FIG. 1, the power path 112 may be positioned in an upper layer of the built-up layers 116, such as a layer of the built-up layers 116 that is positioned above the layer of the built-up layers 116 including the ground path 114. For example, the power path 112 may be positioned in a top layer of the built-up layers 116 and the ground path 114 may be positioned in a second layer of the built-up layers 116, directly beneath the top layer, such that the power path 112 and the ground path 114 are positioned in adjacent layers of the built-up layers 116.

Figure 2:
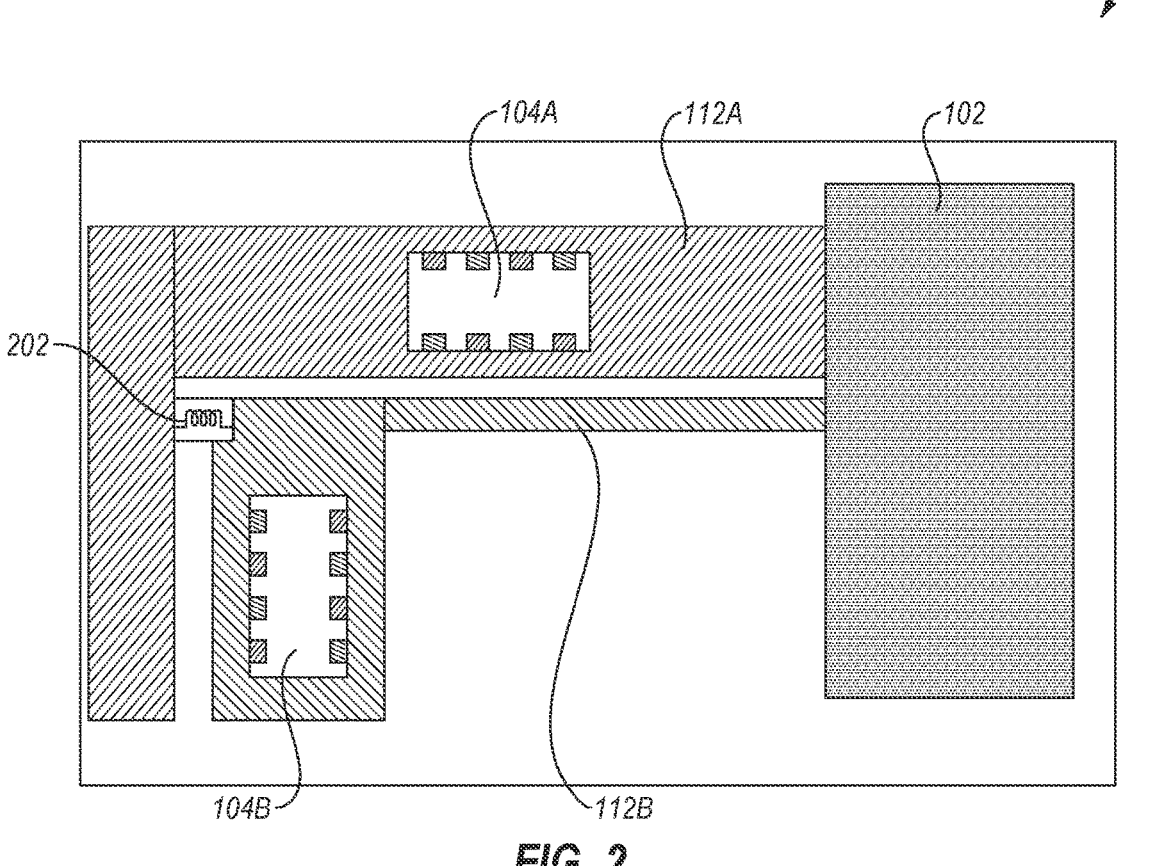
FIG. 2 illustrates a top view of the device package of FIG. 1.

FIG. 2 illustrates a top view of the device 100. Because the power paths 112 are positioned above the ground path 114 only the power paths 112 are shown. The device 100 may include multiple power paths 112A, 112B. For example, a first power path 112A may be to supply power for general operation of the device 100 or die 102 and a second power path 112B may be to supply quiet power to sensitive portions of the device 100 or die 102. Each of the separate power paths 112A, 112B may be coupled to respective capacitors 104A, 104B. For example, the cross-sectional view of the device package 100 illustrated in FIG. 1, may illustrate a cross-sectional view of the device package 100 along one of the first power path 112A or the second power path 112B, such that the power path 112 and the capacitor 104 may illustrate either the first power path 112A and the first capacitor 104A or the second power path 112B and the second capacitor 104B.

The first power path 112A and the second power path 112B may be substantially separate from one another. An inductor 202 may be coupled between the first power path 112A and the second power path 112B to substantially isolate the first power path 112A and the second power path 112B. The inductor 202 may form a high-impedance bridge to substantially prevent noise coupling between the first power path 112A and the second power path 112B. In some examples, the inductor 202 may be formed from a ferrite bead or a spiral inductor integrated on one or more metal layers of the built-up layers 116. A spiral inductor may be rectangular or circular in shape or any other shape without limitations. Isolating the first power path 112A from the second power path 112B may substantially prevent noise from the power in the first power path 112A from inducing noise in the power in the second power path 112B or vice versa.

Figure 3:
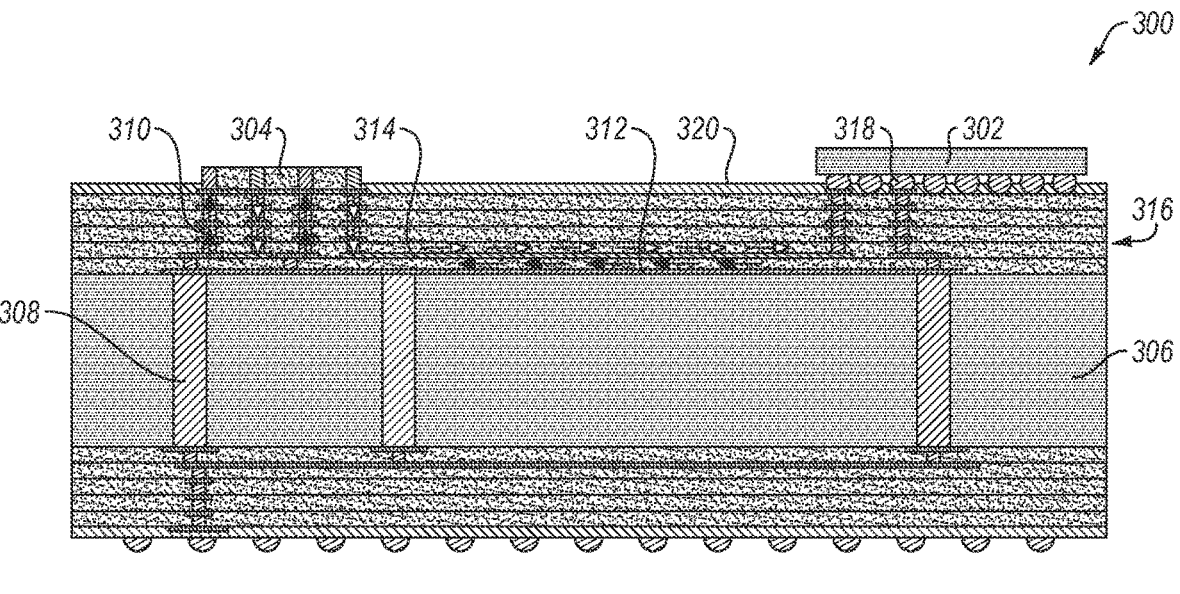
FIG. 3 illustrates a cross-sectional view of device package in accordance with one or more examples of the present disclosure.

FIG. 3 illustrates a cross-sectional view of another example of a device 300. The device 300 may include a core 306 and one or more built-up layers 316 formed over the core 306. The core 306 may include one or more core vias 308 extending through the core 306 connecting the built-up layers 316 on opposite sides of the core 306. The built-up layers 316 may include circuitry (e.g., conductive paths, traces, vias, without limitation), devices (e.g., capacitors, inductors, resistors, without limitation), connection points (e.g., solder pads, terminals, pins, without limitation), silk layers, or copper layers, without limitation.

The device 300 may include a die 302, such as an integrated circuit die or integrated circuit chip, mounted to the device 300 through multiple interconnects 318 coupled to connection points in a top layer 320 (e.g., solder mask layer) of the device 300. The interconnects 318 may couple the die 302 to one or more power paths 312 (e.g., power traces, power planes, power vias, without limitation) and one or more ground paths 314 (e.g., ground traces, ground planes, ground vias, without limitation) located within built-up layers 316 of the device package 300. A capacitor 304 (e.g., decoupling capacitor) may be positioned on the top layer 320 of the device package 300. As described above, the capacitor 304 may be to filter noise out of power being provided to the die 302 through the power path 312. In another example, the capacitor 304 may be positioned between two power paths 312 (e.g., the first power path 112A and the second power path 112B), such that noise from a general power path is substantially prevented from creating noise in a quiet power path supplying power to sensitive portions of the die 302 by the capacitor 304.

As illustrated in FIG. 3, the capacitor 304 may be a multi-terminal capacitor. The capacitor 304 may be electrically coupled between the power paths 312 and the ground paths 314 of the device 300. The multiple capacitor terminals may increase the filtering capacity of the capacitor 304. As illustrated in FIG. 3, the power paths 312 and the ground paths 314 may be located in interior layers of the built-up layers 316 (e.g., layers of the built-up layers 316 that are proximate the core 306). In some examples, one of the power paths 312 or the ground paths 314 may be positioned on a layer of the core 306. For example, a layer of the core 306 may include the ground path 314 and a built-up layer 316 adjacent to the layer of the core 306 may include a power path 312. Alternatively, the layer of the core 306 may include a power path 312 and the adjacent built-up layer 316 may include the ground path 314. The capacitor 304 may be coupled to the power paths 312 and the ground paths 314 through vias 310 passing through the intervening layers of the built-up layers 316. As described above, the multi-terminal capacitor may be arranged, such that current flows in reverse directions among neighboring positive/negative terminal pairs. The vias 310 may be similarly arranged in the built-up layers 316, such that the current flowing through neighboring vias 310 may also be in reverse directions. The arrangement of the vias 310 may reduce the ESL through the current path through negative mutual inductance. The reduction in equivalent series inductance may substantially cancel any additional inductance introduced by a longer current path created by extending the vias 310 through the built-up layers 316 to the interior layers of the built-up layers 316.

As illustrated in FIG. 3, the power path 312 may be positioned below the layer of the built-up layers 316 including the ground path 314. For example, the power path 312 may be positioned in an innermost layer of the built-up layers 316 and the ground path 314 may be positioned in a second layer of the built-up layers 316, e.g., directly above the innermost layer, such that the power path 312 and the ground path 314 are positioned in adjacent layers of the built-up layers 316. In other examples, the power paths 312 and the ground paths 314 may be positioned such that one or more layers of the built-up layers 316 may separate the layers containing the power paths 312 from the layer containing the ground paths 314. In other words, the power paths 312 and the ground paths 314 may not necessarily be located in adjacent layers of the built-up layers 316.

FIG. 4 illustrates a layout view of a layer of a device 400. The layer of the device 400 depicted is the layer of the built-up layers 116 including the power paths, or the built-up layers 316 including the ground paths. FIG. 4 illustrates a general power path 408 and a quiet power path 418. As described above with respect to FIG. 2, the general power path 408 and the quiet power path 418 may be coupled to each other by an inductor 416 to substantially isolate the quiet power path 418 from the general power path 408. A die 420 (e.g., die 102 or die 302) may be coupled to the general power path 408 and the quiet power path 418.

As described above, each of the general power path 408 and the quiet power path 418 (collectively referred to herein as "power paths 408, 418") may be coupled to respective multi-terminal capacitors 402, 410. The general power path 408 may be coupled to power terminals 404 of a multi-terminal capacitor 402. The quiet power path 418 may similarly be coupled to power terminals 412 a multi-terminal capacitor 410. The multi-terminal capacitors 402, 410 may include an even number of terminals, such as from about four terminals to about twelve terminals, where half of the terminals correspond to ground terminals 406, 414 and the other half correspond to power terminals 404, 412. As described above, the power terminals 404, 412 and the ground terminals 406, 414 may alternate sides of the respective multi-terminal capacitors 402, 410, such that each ground terminal 406, 414 neighbors (e.g., is adjacent to) a power terminal 404, 412.

FIG. 5 illustrates a layout view of the layer of the device 400 including the power paths 408, 418. In some examples, the quiet power path 418 may include a capacitor 502 that only includes a single set of terminals 504, 506. The capacitor 502 may be a length-width reversed low ESL ceramic capacitor, such as the LLL capacitor sold by Murata Manufacturing Inc. based in Japan. Because the quiet power path 418 may provide power with significantly less noise than the noise of the power in the general power path 408, the quiet power path 418 may allow a smaller capacitor 502 to be used to filter the noise from the quiet power path 418 than the multi-terminal capacitor 402 used to filter the noise in the general power path 408. Using a smaller capacitor 502 may reduce the space being used for the capacitor 502, which may provide additional space for other components of the device 400. Similarly, fewer vias 110, 310 may be used which may provide additional space on each layer of the respective built-up layers 116, 316.

Non-limiting examples of the disclosure include:

Example 1: A device comprising: an electronic die; a ground path; a power path coupled to the electronic die, the power path including a first capacitor coupled between the power path and the ground path; a quiet power path coupled to the electronic die, the quiet power path including a second capacitor coupled between the quiet power path and the ground path; and an inductor coupled between the quiet power path and the power path.

Example 2: The device of example 1, wherein the first capacitor is a multi-terminal capacitor.

Example 3: The device of example 1 or example 2, wherein each of the first capacitor and the second capacitor are respective multi-terminal capacitors.

Example 4: The device of any one of examples 1 through 3, wherein the second capacitor comprises a single set of terminals.

Example 5: The device of any one of examples 1 through 4, wherein the first capacitor may include multiple terminals.

Example 6: The device of any one of examples 1 through 5, wherein the second capacitor may include multiple terminals.

Example 7: A device comprising: a core; built-up layers arranged over the core; a ground path disposed in a first built-up layer of the built-up layers; a power path disposed in a second built-up layer of the built-up layers; and a multi-terminal capacitor on a top layer of the built-up layers, the multi-terminal capacitor coupled to the ground path and the power path through respective vias passing through the built-up layers, wherein the respective vias are arranged to alternate such that respective vias coupled to the power path neighbor a respective via coupled to the ground path.

Example 8: The device of example 7, wherein the second built-up layer is positioned above the first built-up layer.

Example 9: The device of example 7 or example 8, wherein the second built-up layer is adjacent to the top layer of the built-up layers.

Example 10: The device of any one of examples 7 through 9, wherein the top layer of the built-up layers comprises a solder mask layer.

Example 11: The device of any one of examples 7 through 10, further comprising an electronic die coupled to the power path through the top layer of the built-up layers.

Example 12: The device of any one of examples 7 through 11, wherein the first built-up layer, the second built-up layer, and the top layer are each on a same side of the core.

Example 13: A device comprising: a core; built-up layers arranged over the core; a ground path; a power path; and a multi-terminal capacitor on a top layer of the built-up layers, the multi-terminal capacitor coupled to the ground path and the power path through respective vias passing through the built-up layers, wherein the respective vias are arranged to alternate such that respective vias coupled to the power path neighbor a respective via coupled to the ground path; wherein one of the ground path and the power path are disposed in a first built-up layer of the built-up layers and another of the ground path and the power path are disposed on a layer of the core.

Example 14: The device of example 13, wherein the first built-up layer is positioned adjacent to the layer of the core.

Example 15: The device of example 13 or example 14, wherein the first built-up layer, the layer of the core, and the top layer are each on a same side of the core.

Example 16: A method comprising: forming at least two built-up layers over a core; forming a power path and a quiet power path on a first built-up layer of the at least two built-up layers; forming at least one ground path on a second built-up layer of the at least two built-up layers; coupling the power path to the at least one ground path through a first capacitor; coupling the quiet power path to the at least one ground path through a second capacitor; and coupling the power path to the quiet power path with an inductor.

Example 17: The method of example 16, comprising coupling an electronic die to the power path and the quiet power path.

Example 18: The method of example 16 or example 17, comprising positioning the first capacitor on a top surface of a device and coupling the first capacitor to the power path through a first set of vias and coupling the capacitor to the ground path through a second set of vias.

Example 19: The method of any one of examples 16 through 18, wherein the first capacitor comprises a multi-terminal capacitor.

Examples of the present disclosure may filter noise from power circuits at a package level of a device. Filtering noise from the power circuits at the package level, may enable greater amounts of noise to be filtered. Furthermore, constructing a noise filtering apparatus at the package level may reduce the costs of the associated printed circuit board (PCB) and devices.

Examples of the present disclosure may also increase noise isolation between general power circuits and quiet power circuits. Increasing noise isolation between general power circuits and quiet power circuits may improve the noise in delivery of power from the quiet power circuits. Increasing quiet delivery of power from the quiet power circuits may increase the operation of the associated devices and components receiving the quiet power from the quiet power circuits.

The examples of the disclosure described above and illustrated in the accompanying drawing figures do not limit the scope of the invention, since these examples are merely examples of examples of the invention, which is defined by the appended claims and their legal equivalents. Any equivalent examples are intended to be within the scope of this disclosure. Indeed, various modifications of the present disclosure, in addition to those shown and described herein, such as alternative useful combinations of the elements described, may become apparent to those skilled in the art from the description. Such modifications and examples are also intended to fall within the scope of the appended claims and their legal equivalents.

What is claimed is:

1. A device comprising:
an electronic die;
a ground path;
a power path coupled to the electronic die;
a first capacitor coupled between the power path and the ground path;
a quiet power path coupled to the electronic die;
a second capacitor coupled between the quiet power path and the ground path; and
an inductor coupled between the quiet power path and the power path.

2. The device of claim 1, wherein the first capacitor is a multi-terminal capacitor.

3. The device of claim 1, wherein each of the first capacitor and the second capacitor are respective multi-terminal capacitors.

4. The device of claim 1, wherein the second capacitor comprises a single set of terminals.

5. The device of claim 1, wherein the first capacitor may include multiple terminals.

6. The device of claim 1, wherein the second capacitor may include multiple terminals.

7. A device comprising:
a core;
built-up layers arranged over the core;
a ground path disposed in a first built-up layer of the built-up layers;
a power path disposed in a second built-up layer of the built-up layers;
a clean power path disposed in the second built-up layer;
an inductor coupled between the power path and the clean power path; and
a multi-terminal capacitor on a top layer of the built-up layers, the multi-terminal capacitor coupled to the ground path and the power path through respective vias passing through the built-up layers, wherein the respective vias are arranged to alternate such that respective vias coupled to the power path neighbor a respective via coupled to the ground path.

8. The device of claim 7, wherein the second built-up layer is positioned above the first built-up layer.

9. The device of claim 7, wherein the second built-up layer is adjacent to a top layer of the built-up layers.

10. The device of claim 7, further comprising a solder mask layer over a top layer of the built-up layers.

11. The device of claim 7, further comprising an electronic die coupled to the power path through a top layer of the built-up layers.

12. The device of claim 7, wherein the first built-up layer, the second built-up layer, and a top layer are each on a same side of the core.

13. A device comprising:
a core;
built-up layers arranged over the core;
a ground path;
a power path;
a clean power path;
an inductor coupled between the power path and the clean power path; and
a multi-terminal capacitor on a top layer of the built-up layers, the multi-terminal capacitor coupled to the ground path and the power path through respective vias passing through the built-up layers, wherein the respective vias are arranged to alternate such that respective vias coupled to the power path neighbor a respective via coupled to the ground path;
wherein one of the ground path and the power path are disposed in a first built-up layer of the built-up layers and another of the ground path and the power path are disposed on a layer of the core.

14. The device of claim 13, wherein the first built-up layer is positioned adjacent to the layer of the core.

15. The device of claim 13, wherein the first built-up layer, the layer of the core, and the top layer are each on a same side of the core.

16. A method of manufacturing a device comprising:
forming at least two built-up layers over a core;
forming a power path and a clean power path on a first built-up layer of the at least two built-up layers;
forming at least one ground path on a second built-up layer of the at least two built-up layers;
coupling the power path to the at one on ground path through a first capacitor;
coupling the clean power path to the at least one ground path through a second capacitor, and
coupling the power path to the clean power path with an inductor.

17. The method of claim 16, comprising coupling an electronic die to the power path and the clean power path.

18. The method of claim 16, comprising positioning the first capacitor on a top surface of the device ad coupling the first capacitor to the power path through a first set of vias and coupling the first capacitor to the at least one ground path through a second set of vias.

19. The method of claim 16, wherein the first capacitor comprises a multi-terminal capacitor.

* * * * *